(12) United States Patent
Mikhailov et al.

(10) Patent No.: US 7,075,739 B2
(45) Date of Patent: Jul. 11, 2006

(54) ASSEMBLY FOR CORRECTING LASER ILLUMINATION EMITTED FROM A LASER LIGHT SOURCE AND METHOD FOR PRODUCING SAID ASSEMBLY

(75) Inventors: Alexei Mikhailov, Dortmund (DE); Vitalij Lissotschenko, Fröndenberg (DE)

(73) Assignee: Hentze-Lissotschenko Patentverwaltungs GmbH & Co. KG, Norderfriedrichskoog (DE)

( * ) Notice: Subject to any disclaimer, the term of this patent is extended or adjusted under 35 U.S.C. 154(b) by 0 days.

(21) Appl. No.: 10/471,600

(22) PCT Filed: Mar. 23, 2002

(86) PCT No.: PCT/EP02/03283

§ 371 (c)(1),
(2), (4) Date: Sep. 24, 2003

(87) PCT Pub. No.: WO02/082164

PCT Pub. Date: Oct. 17, 2002

(65) Prior Publication Data

US 2004/0090519 A1    May 13, 2004

(30) Foreign Application Priority Data

Apr. 7, 2001  (DE) ................ 101 17 564
Mar. 5, 2002  (DE) ................ 102 09 605

(51) Int. Cl.
G02B 5/04    (2006.01)
G02B 27/00   (2006.01)
G02B 27/09   (2006.01)
H01S 3/00    (2006.01)

(52) U.S. Cl. .............. 359/831; 359/837; 359/640; 372/100

(58) Field of Classification Search .............. 359/618, 359/619, 831, 837, 640; 372/75, 100; 362/555
See application file for complete search history.

(56) References Cited

U.S. PATENT DOCUMENTS 5,390,024 A * 2/1995 Wright .................. 356/611

(Continued)

FOREIGN PATENT DOCUMENTS

DE    195 14 626    10/1996

(Continued)

*Primary Examiner*—Ricky D. Shafer
(74) *Attorney, Agent, or Firm*—Hoffman, Wasson & Gitler

(57) ABSTRACT

The invention relates to an assembly for correcting laser illumination emitted from a laser light source, comprising a laser light source, which has linear emission sources that are arranged in a row in a first direction (X), whereby in addition, the emission sources that are arranged essentially in a row are at least partially offset relative to the row in a perpendicular direction (Y) in relation to the first direction (X). The assembly also comprises corrective elements, which can correct the laser illumination emitted from the laser light source in such a way that the spatial distortion of the laser illumination, caused by the offset position of the emission sources relative to the row, is compensated. According to the invention, the corrective elements are configured as a plate array that comprises a number of plate elements consisting of substantially plane-parallel plates that are transparent to the laser illumination used. At least two of the plate elements have a different thickness and the corrective mans is located in the laser illumination emitted from the laser light source, in such a way that the light beams emitted from at least two emission sources that are offset in relation to one another are subjected to a respective beam offset of a different magnitude by two different plate elements, thus compensating the distortion caused by the offset position of the emission sources. The invention also relates to a method for producing the aforementioned assembly.

4 Claims, 4 Drawing Sheets

U.S. PATENT DOCUMENTS

| | | | |
|---|---|---|---|
| 5,562,334 A * | 10/1996 | Wortel | 353/69 |
| 5,854,651 A | 12/1998 | Kessler et al. | |
| 5,887,096 A * | 3/1999 | Du et al. | 385/39 |
| 6,044,096 A * | 3/2000 | Wolak et al. | 372/36 |
| 6,115,185 A * | 9/2000 | Du et al. | 359/628 |
| 6,166,759 A | 12/2000 | Blanding | |
| 6,377,599 B1 * | 4/2002 | Marshall | 372/75 |
| 6,421,178 B1 * | 7/2002 | Lissotschenko et al. | 359/559 |
| 6,437,896 B1 * | 8/2002 | Lissotschenko et al. | 359/196 |
| 6,504,650 B1 * | 1/2003 | Alfrey | 359/627 |
| 6,556,352 B1 * | 4/2003 | Wang et al. | 359/641 |

FOREIGN PATENT DOCUMENTS

| | | |
|---|---|---|
| DE | 197 22 592 | 12/1997 |
| DE | 196 45 150 | 5/1998 |
| DE | 198 20 154 | 9/1999 |
| DE | 198 41 285 | 6/2000 |
| DE | 199 48 889 | 6/2001 |
| WO | WO 0127686 | 4/2001 |

* cited by examiner

ASSEMBLY FOR CORRECTING LASER ILLUMINATION EMITTED FROM A LASER LIGHT SOURCE AND METHOD FOR PRODUCING SAID ASSEMBLY

BACKGROUND OF THE INVENTION

This invention relates to an arrangement for correction of laser radiation emanating from a laser light source, including a laser light source which has linear emission sources which are located essentially in at least one row in a first direction, furthermore the emission sources located essentially in a row being offset in the direction perpendicular to the first direction at least partially to the row, and the arrangement furthermore having correction means which can correct the laser radiation emanating from the laser light source such that the three-dimensional distortion of the laser radiation caused by the offsetting of the emission sources to the row is equalized. Furthermore this invention relates to a process for producing this arrangement.

An arrangement and a process of the initially mentioned type is known from U.S. Pat. No. 6,166,759. In the arrangement described, the so-called "smile" distortion, which generally occurs in laser diode bars, and which corresponds essentially to the bending of the row of emission sources, is corrected. The correction means is a glass fiber, which acts at the same time as a collimator lens, the glass fiber being aligned essentially parallel to the row of emission centers and thus to the first direction. Using these glass fibers at the same time, the fast axis divergence of the laser light proceeding from the laser diode bar is collimated. In order to be able to keep up with its correction function, the glass fiber is deliberately bent by means of an externally complex mechanical bending instrument, such that the light emanating from the individual emission centers which are offset to one another strikes the transverse side of the optical fiber facing the laser diode bar roughly in the center. In this way, the light beams emanating from the individual emission sources and passing through the optical fibers are made inherently parallel, but have a minimum beam offset against one another. In this arrangement, which is known from the art, it has been found to be especially disadvantageous that the instrument used for bending the glass fibers has a relatively complex structure, because the glass fibers at some points must be deliberately bent by only a few microns or fractions of microns relative to other points.

U.S. Pat. No. 5,854,651 discloses an arrangement and a process of the initially mentioned type in which plane-parallel plates are used as the correction means, among others. These plane-parallel plates are arranged in the beam direction downstream of a collimation lens for the fast axis and downstream of the focusing lenses for the slow axis and furthermore downstream of another focusing lens for the fast axis. The plane-parallel plates are tilted according to the previously measured "smile" distortion to the optical axis. The disadvantage here is that on the one hand for each of these plane-parallel plates according to the vertical offset of the assigned emission center of the laser diode bar an exact tilting angle relative to the optical axis must be set. On the other hand, it can be considered especially disadvantageous that this angle must be selected to be exceedingly exact as a result of the beam offset which is to be very exactly implemented. This can be done under certain circumstances only with very high cost.

It is one object of this invention is to devise an arrangement and a process of the initially mentioned type which can be more easily implemented.

SUMMARY OF THE INVENTION

There is provided, correction means that are made as a prism array. One such prism array can be produced more easily than the bent glass fiber known from the existing art.

Advantageously, the prism array is made of individual prism elements which are arranged in the laser radiation emanating from the laser light source such that the light beams emanating from at least two emission sources which are offset to one another are incident on different prism elements and are deflected on one of their prism surfaces at a different angle such that the distortion caused by the offset of these emission sources is corrected. Ultimately, to produce one such prism array there must be simply a number of prism elements which differs by relatively small angles so that after corresponding analysis of the "smile" distortion the elements which are suitable for correction are joined to one another, especially cemented to one another. One such prism array can be located in the beam direction downstream of the cylinder lens or cylinder lens-like lens which is used as the collimator lens of fast axis divergence.

There is provided correction means that are made as a plate array and the plate array includes a number of plate elements which are made of plane-parallel plates which are transparent to the laser radiation used, at least two of the plate elements having a different thickness and the correction means being located in the laser radiation emanating from the laser light source such that the light beams emanating from at least two emission sources which are offset to one another experience beam offset of different intensity by two different plate elements so that the distortion caused by the offset of these emission sources is equalized. This plate array can also be produced more easily than the optical fibers known from the existing art.

Advantageously, the correction means can be located at a definable angle to the middle propagation direction of the laser radiation passing through it. In particular, the normal can be located on one entry surface of the correction means at a definable angle to the middle propagation direction of the laser radiation passing through the correction means. Here, the angle can be changed deliberately after inserting the plate array which is used as the correction means into the beam path until optimum correction of the "smile" distortion is achieved. This offers clear advantages relative to U.S. Pat. No. 5,854,651 because in the arrangement described in it the angle must be set very exactly as the only variable parameter.

It is possible for the correction means to be made as a one-piece monolithic block. By this execution, the production of the correction means is made much simpler because plates which have been manufactured separately from one another need not be positioned and cemented to one another. Such a plate array can be produced for example by the laser radiation emanating from the laser light source, after passing through one cylinder lens or a cylinder lens-like lens with cylinder axes aligned essentially parallel to the first direction in which the row of emission sources also extends, being analyzed with respect to its three-dimensional distribution and then the thicknesses of the individual plate elements being chosen according to the analysis.

This plate array can also be located downstream of a cylinder lens or a cylinder lens-like lens which focuses the light emanating from the laser light source which is made as a laser diode bar with respect to the fast axis divergence.

In order to convert the laser radiation which has been focused after passage through the cylinder lens or cylinder lens-like lens and through the plate array back into radiation parallel with respect to the fast axis, on the side of the correction means made as a plate array facing away from the cylinder lens or cylinder lens-like lens there can be a concave lens which refracts the laser radiation focused with respect to the direction perpendicular to the first direction such that this laser radiation which is essentially parallel with respect to the direction which is perpendicular to the first direction emerges from the concave lens. This then parallel laser radiation can be more easily processed, especially can be imaged onto a glass fiber.

It can be considered especially advantageous in the aforementioned arrangements that the laser light source can be applied to a cooling device before analysis of the laser radiation. Generally, in laser diode bars, by screwing onto a cooling device which is made for example as a copper plate the "smile" distortion is first produced or enlarged. The arrangement and the process for producing the arrangement enable analysis and correction of the "smile" distortion after finished mounting on the laser diode bar on a cooling device. The arrangement also corrects the distortions which are formed first by the installation of the laser diode bar.

In the aforementioned arrangements, one or more of the emission sources can be assigned to each of the prism elements or each of the plate elements. The number of emission sources assigned to each of the aforementioned elements of course depends, on the one hand, on the degree of offset of the individual emission sources to one another, and, on the other, on the accuracy with which the correction is to be carried out. Generally, the correction would certainly be most exact when for each individual emission source there is one single one of the prism elements or plate elements which is located or made according to the offset of this individual emission source.

BRIEF DESCRIPTION OF THE DRAWINGS

Other features and advantages of this invention become clear using the following description of preferred embodiments with reference to the attached drawings:

FIG. 2b shows a view according to the arrow IIb in FIG. 2a;

FIG. 4b shows a side view of the arrangement as shown in FIG. 5a;

FIG. 5b shows a view according to the arrow Vb in FIG. 5a;

FIG. 6b shows a view according to the arrow VIb in FIG. 6a; and

DETAILED DESCRIPTION OF THE INVENTION

FIGS. 1 to 4 and FIGS. 6 and 7 show coordinate systems for illustrating the orientation.

Figure 1A:
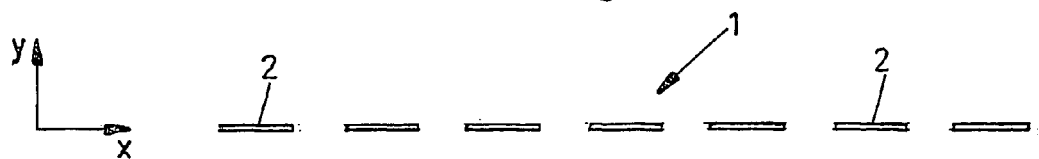
FIG. 1a shows a schematic view of a number of emission sources of a laser diode bar in an ideal arrangement.

FIG. 1a shows a schematic view of a laser light source 1 with emission sources 2 located in a row. These laser light sources 1 are generally made as laser diode bars. The dimensions can be, for example, such that the entire width of the laser diode bar in the direction of the illustrated row is roughly 10 mm, conversely the width in the direction of the row of the individual emission sources 2 is roughly 200 microns. The proportions are not true to nature here, but are shown only schematically in order to illustrate the problems associated with the "smile" distortion which is detailed below. The spread of the emission sources 2 in one direction perpendicular to the direction of the row is for example 1 micron.

Figure 1B:
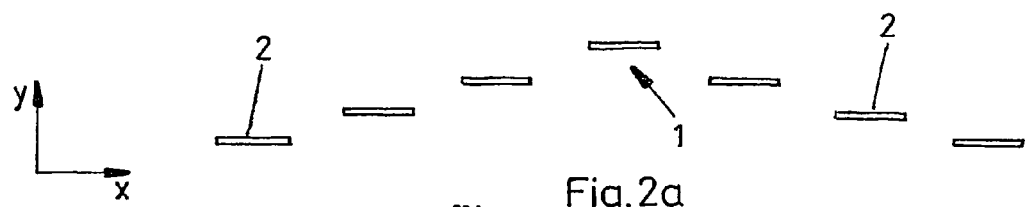
FIG. 1b shows a schematic view of emission sources of a laser diode bar in a faulty arrangement shown overdrawn.

FIG. 1b shows emission sources 2 which are not ideally arranged and thus which roughly reproduce the light emitted from the laser diode bar. It is clear that the individual emission sources 2 deviate from a row arrangement. This deviation is shown very drastically in FIG. 1 for purposes of illustration. These deviations can vary in a range of magnitudes between 0.1 to 5 microns. It should be expressed clearly again that the major deviations which are pronounced relative to the height of the emission sources 2 were chosen in this size only for illustration.

This distortion of the laser light emerging from the laser diode bar is generally called a "smile" distortion and can be caused or amplified for example by the laser diode bar being screwed onto a base consisting of a copper block for heat dissipation with the corresponding holding means.

Figure 2A:
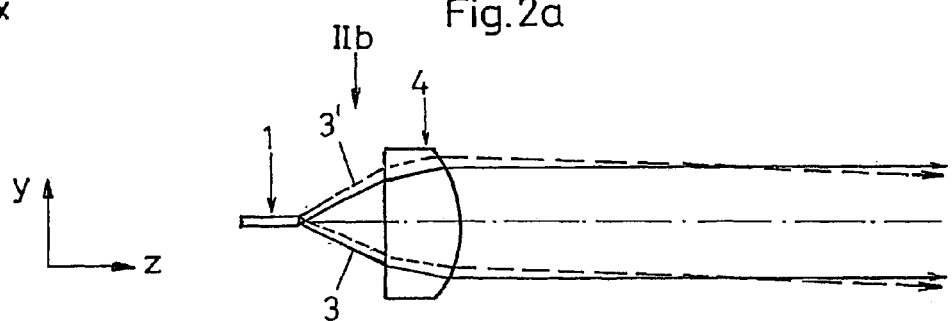
FIG. 2a shows a side view of a collimation means known from the prior art with a laser light source as shown in FIG. 1b.
Figure 2B:
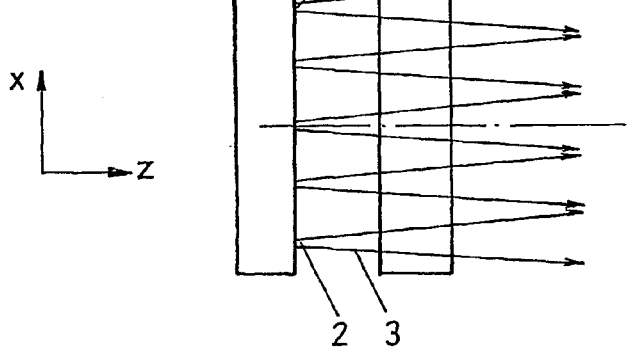

FIGS. 2a and 2b show that collimation of the light beams 3, 3' which emanate from the laser light source 1 as shown in FIG. 1b entails problems. In FIGS. 2a and 2b reference number 4 labels a convex cylinder lens which in this arrangement is used as a collimation lens of fast axis divergence of the laser light emanating from the laser diode bar. Based on the fact that individual emission sources 2 are offset to one another in the Y direction, beams parallel to the optical axis and thus to the Z direction are formed only for light beams 3 which emanate from emission sources 2 which are located essentially on the optical axis of the arrangement as shown in FIGS. 2a and 2b after passing through the cylinder lens 4. Light beams 3' which for example are offset upwards to the optical axis leave the cylinder lens 4 at an angle to the optical axis or to the Z direction. The deviation of the light beams 3, 3' from one another is shown exaggerated for illustration. The imaging of laser radiation from these light beams 3, 3' for example onto an optical fiber is extremely difficult or very ineffective without the corresponding correction means.

Figure 3:
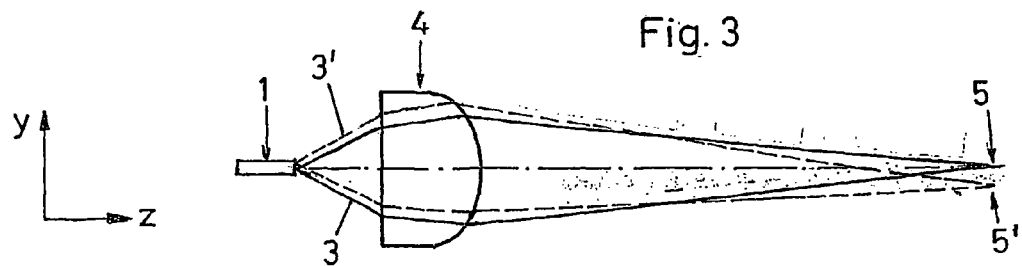
FIG. 3 shows a side view of a focusing arrangement with a laser light source as shown in FIG. 1b.

In FIG. 3, the cylinder lens 4 which was used for collimation in FIGS. 2a and 2b are made as a focusing lens so that the beams passing through the cylinder lens 4 are focused in the focal plane. Alternatively the transition from FIG. 2a to FIG. 3 can also be achieved in that the distance between the cylinder lens 4 and the laser light source 1 is changed. As a result of the offset arrangement of individual emission sources 2 in the Y direction there is also an offset arrangement of the focal points 5, 5' of the light beams 3, 3' emanating from the different emission sources.

Figure 4A:
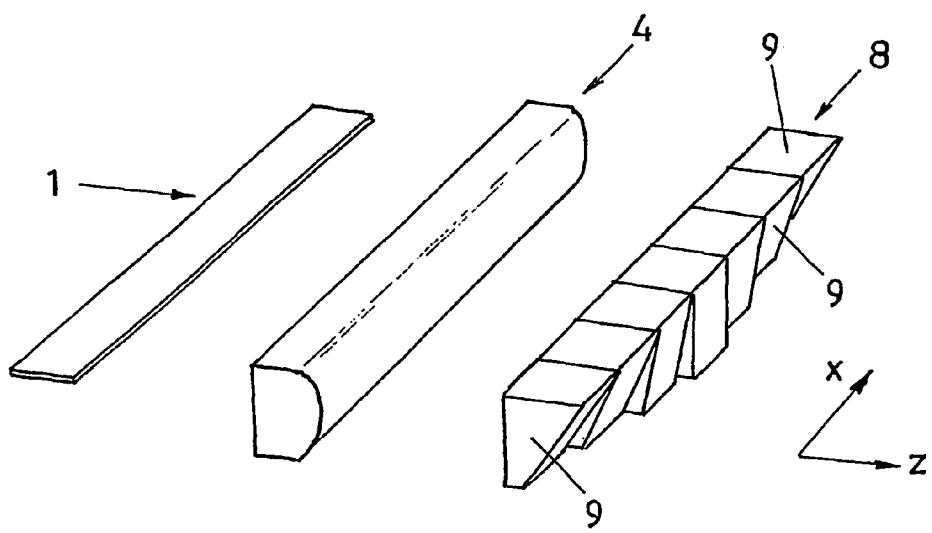
FIG. 4a shows a perspective view of an arrangement as claimed in the invention with a first embodiment of the correction means as claimed in the invention.
Figure 4B:
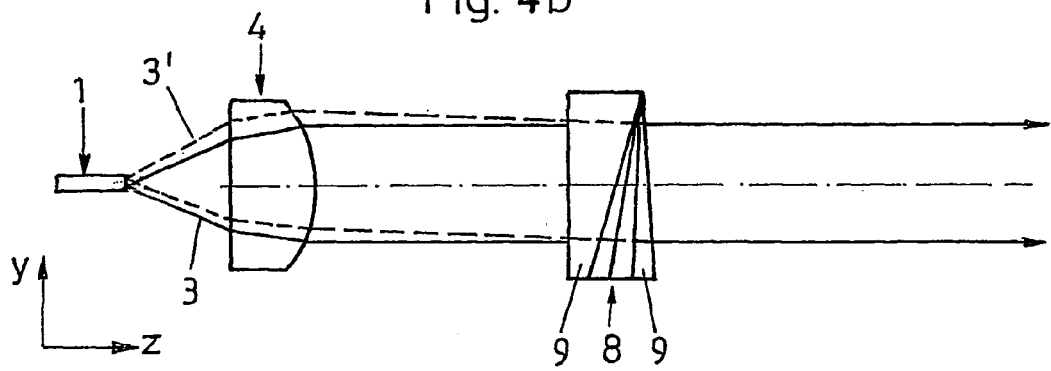

FIG. 4 shows a first arrangement as claimed in the invention in which a correction means 8 which is made as a prism array is used. In this arrangement first the light emanating from the cylinder lens 4 can be analyzed with respect to its three-dimensional distribution. Then prism elements 9 are prepared which differ by different prism angles. Then these prism elements 9 are combined into a prism array. In doing so one of the prism elements 9 at a time can be assigned to one or more of the emission sources 2. The correction means 8 which is made as a prism array is located in the Z direction downstream of the cylinder lens 4, the cylinder lens 4 being located as a collimation lens so that the beams 3, 3' emerging from the cylinder lens 4 are essentially inherently parallel. These inherently parallel beams 3, 3' are more or less strongly deflected in the individual prism elements 9 depending on the prism angle. The positioning of the prism array in the beam paths of the beams 3, 3' emerging from the cylinder lens 4 should be selected such that the prism surfaces used for deflection are located roughly in the area of the intersection points of the beams 3, 3' downstream of the cylinder lens 4 (see also FIG. 2a in this respect) so that the deflected beams 3, 3' leave the prism array roughly at the same position. The aforementioned area is among others dependent on the focal length of the cylinder lens 4 and is shown only schematically in FIG. 2a and FIG. 5b. FIG. 5b shows that after passage through the correction means 8 which is made as a prism array all the beams 3, 3' emerging from the different emission sources 2 run parallel to one another and are located essentially identically in the Y direction.

Figure 5A:
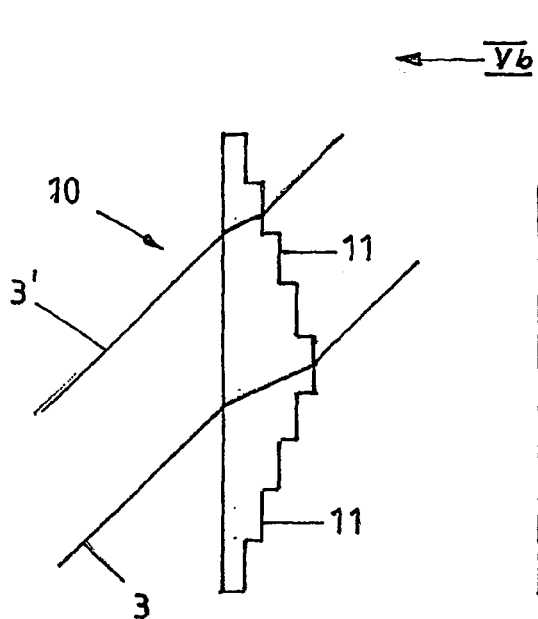
FIG. 5a shows a side view of a second correction means as claimed in the invention.
Figure 5B:
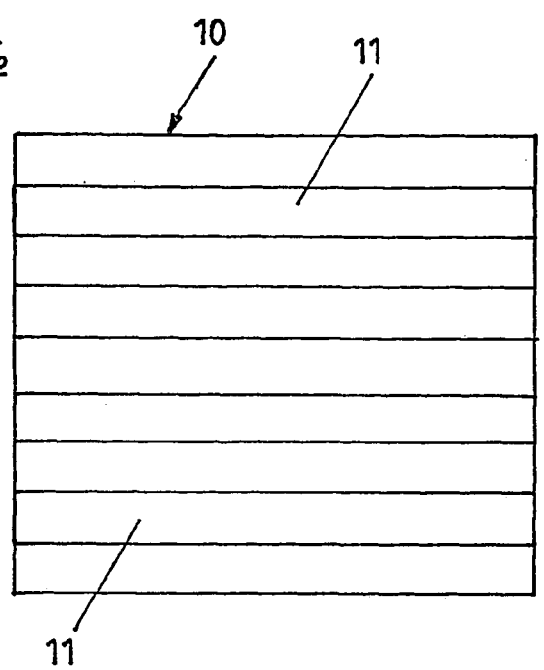
Figure 6A:
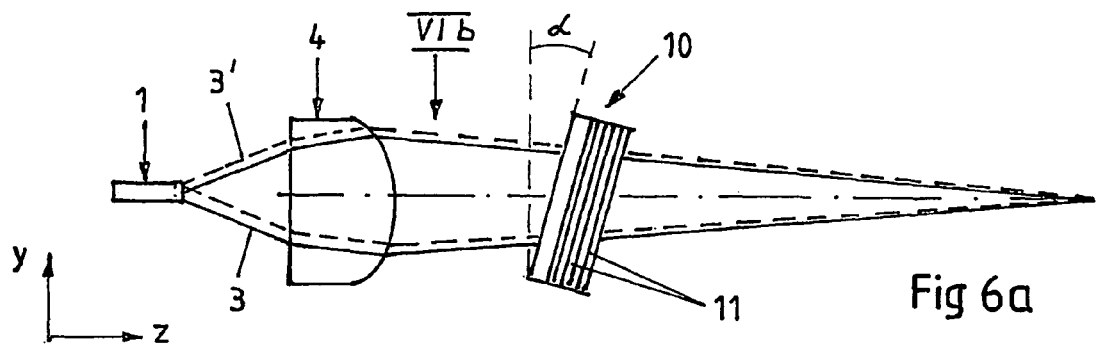
FIG. 6a shows an arrangement as claimed in the invention with the second correction means as claimed in the invention.

FIG. 6a shows a second embodiment of an arrangement as claimed in the invention which comprises a second embodiment of a correction means 10 (see also FIG. 5a and FIG. 5b). In this correction means 10 plate elements 11 which are combined into a plate array which forms the correction means 10 are assigned to one or more of the emission sources 2. The plate elements 11 can consist for example of plane-parallel plates of a transparent material. In the embodiment shown the plate elements 11 are made as individual sections of a one-piece plate array. The individual plate elements 11 depending on the light beams 3, 3' to be corrected have a suitable thickness. FIG. 5a shows that for oblique incidence on one such plate array 10 the light beams 3, 3' which pass through plate elements 11 of varying thickness experience beam offset of varied intensity.

Figure 6B:
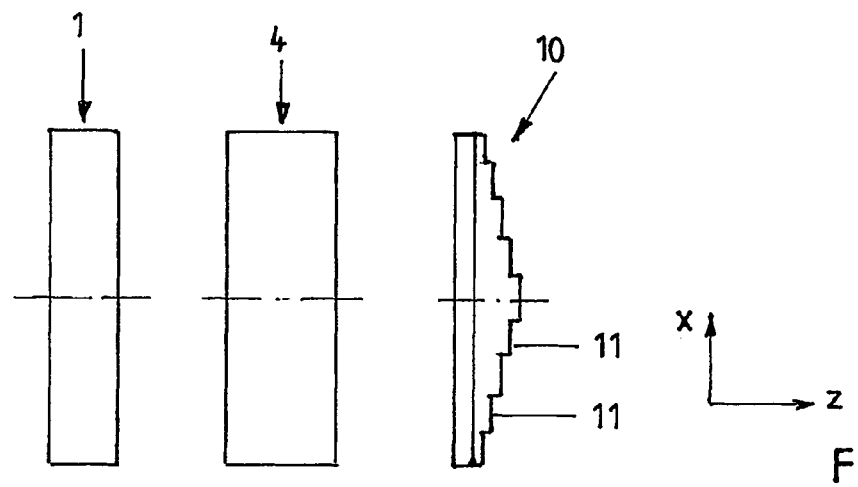

For example, it can be provided that before producing the plate array which is used as the correction means 10 the light emanating from the cylinder lens 4 is analyzed with respect to its three-dimensional distribution. Then a plate array with plate elements 11 of varied thickness is produced, the thickness of the individual plate elements 11 being dependent on the corresponding offset in the X direction of the emission sources 2 with light beams 3, 3' passing through the corresponding plate element 11. Then the plate array being used as the correction means 10 as shown in FIG. 6a and FIG. 6b is located in the beam path downstream of the cylinder lens 4 and is tilted at an angle α to the Y direction.

One especially interesting advantage of the invention is that the angle α after inserting the plate array which is being used as the correction means 10 into the beam path can be changed deliberately until optimum correction of the "smile" distortion is achieved.

FIG. 6a shows that the correction means 10 is placed in an arrangement in which the cylinder lens 4 is used as a focusing lens so that the beams 3, 3' are focused into one focal plane. Since the plane-parallel plates cause a beam offset, thus beam offsets of the light beams 3, 3' focused by the cylinder lens 4 can also be achieved by the correction means 10 which is made as a plate array, so that after passing through the correction means 10 the beams 3, 3' from different emission centers 2 coincide with respect to the Y direction in the focal plane.

Figure 7:
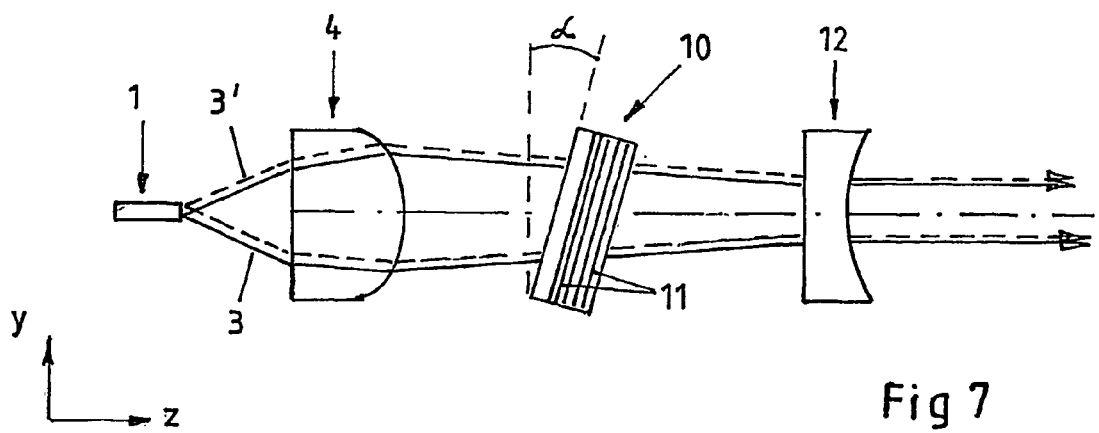
FIG. 7 shows a side view of another embodiment of the arrangement as claimed in the invention with the second correction means as claimed in the invention.

FIG. 7 shows that the light which has passed through the correction means 10 made as a plate array is converted into light which is parallel to the Z direction with respect to the fast axis or the Y direction by means of a concave lens 12 which is made for example as a cylinder lens so that fast axis collimation with simultaneous "smile" correction is implemented by the arrangement formed from the cylinder lenses 4, the correction means 10 and the concave lenses 12.

The cylinder lens 4 can of course be replaced in all the illustrated embodiments by a cylinder lens-like lens or one of equivalent action.

The invention claimed is:

1. An arrangement for correction of laser radiation emanating from a laser light source, comprising the laser light source which has linear emission sources which are located essentially in at least one row in a first direction (X), the emission sources located essentially in a row being offset in the direction (Y) perpendicular to the first direction (X) at least partially to the row, and the arrangement further comprising correction means which can correct the laser radiation emanating from the laser light source such that the three-dimensional distortion of the laser radiation caused by the offsetting of the emission sources to the row is equalized, wherein the correction means are made as a prism array, the prism array comprises individual prism elements, the laser radiation passing through the prism array, at least two of the prism elements having different prism angles, the individual prism elements arranged in the laser radiation emanating from the laser light source such that the light beams emanating from at least two emission sources which are offset to one another are incident on different prism elements and are deflected on one of their prism surfaces at a different angle such that the distortion caused by the offset of these emission sources is corrected.

2. The arrangement as claimed in claim 1, wherein between the correction means and the laser light source there is a cylinder lens or cylinder lens-like lens with a cylinder axis which extends essentially in the first direction (X).

3. The arrangement as claimed in claim 2, wherein the cylinder lens or the cylinder lens-like lens causes collimation of the laser radiation emanating from the laser light source in the direction (Y) which is perpendicular to the first direction (X).

4. The arrangement as claimed in claim 1, wherein the laser light source is made as a laser diode bar.

* * * * *